(12) United States Patent
Nakata et al.

(10) Patent No.: US 6,788,592 B2
(45) Date of Patent: Sep. 7, 2004

(54) MEMORY DEVICE WHICH CAN CHANGE CONTROL BY CHIP SELECT SIGNAL

(75) Inventors: Daisuke Nakata, Kawasaki (JP); Yoshinobu Higuchi, Kawasaki (JP); Nobuyoshi Wakasugi, Aichi (JP); Kazuhiro Kitazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/365,452

(22) Filed: Feb. 13, 2003

(65) Prior Publication Data

US 2003/0174547 A1 Sep. 18, 2003

(30) Foreign Application Priority Data

Mar. 15, 2002 (JP) ........................................ 2002-072725

(51) Int. Cl.[7] .............................................. G11C 7/00
(52) U.S. Cl. .................................. 365/191; 365/189.01
(58) Field of Search ........................ 365/189.01, 189.02, 365/189.03, 191, 52, 63; 711/5, 100–109

(56) References Cited

U.S. PATENT DOCUMENTS

| | | | | |
|---|---|---|---|---|
| 5,712,811 A | * | 1/1998 | Kim | 365/63 |
| 5,818,350 A | * | 10/1998 | Estakhri et al. | 711/5 |
| 6,078,526 A | * | 6/2000 | Mitani | 365/185.33 |
| 6,289,411 B1 | * | 9/2001 | Okumura et al. | 711/5 |
| 6,535,422 B2 | * | 3/2003 | Goto et al. | 365/185.11 |
| 2003/0137881 A1 | * | 7/2003 | Sasaki | 365/189.09 |

FOREIGN PATENT DOCUMENTS

| | | |
|---|---|---|
| JP | 02-144639 | 6/1990 |
| JP | 05-081850 | 4/1993 |
| JP | 05-210577 | 8/1993 |
| JP | 2000-003305 | 1/2000 |

* cited by examiner

Primary Examiner—Son Mai
(74) Attorney, Agent, or Firm—Arent Fox PLLC

(57) ABSTRACT

A memory device has an address terminal for inputting a plural bits of address signal, and a chip select terminal for inputting an external chip select signal, and an access mode controlling circuit which can switch a first control mode for controlling enable/disable of memory device according to plural external chip select signals and a predetermined address signal in the address signal to be input, and a second control mode for controlling the enable/disable according to a single external chip select signal. If the memory device is larger than a first memory area which can be controlled by a single chip select signal, the memory device can be directly connected to the memory control unit by setting the access mode control circuit to the first control mode. If the memory device is less than the first memory area, the access mode control circuit is set to the second control mode.

15 Claims, 14 Drawing Sheets

ACCESS MODE CONTROL CIRCUIT EXAMPLE

| CASE | #CS1 | #CS2 | A22D | A22S | #CS | A22 |
|------|------|------|------|------|-----|-----|
| 1    | 0    | 0    | 0    | 0    | 0   | 1   |
| 2    | 1    | 0    | 0    | 0    | 0   | 1   |
| 3    | 0    | 1    | 0    | 0    | 0   | 0   |
| 4    | 1    | 1    | 0    | 0    | 1   | 0   |
| 5    | 0    | 0    | 1    | 0    | 0   | 0   |
| 6    | 1    | 0    | 1    | 0    | 1   | 0   |
| 7    | 0    | 1    | 1    | 0    | 0   | 0   |
| 8    | 1    | 1    | 1    | 0    | 1   | 0   |
| 9    | 0    | 0    | 0    | 1    | 0   | 1   |
| 10   | 1    | 0    | 0    | 1    | 0   | 1   |
| 11   | 0    | 1    | 0    | 1    | 0   | 1   |
| 12   | 1    | 1    | 0    | 1    | 1   | 1   |
| 13   | 0    | 0    | 1    | 1    | 0   | 1   |
| 14   | 1    | 0    | 1    | 1    | 1   | 1   |
| 15   | 0    | 1    | 1    | 1    | 0   | 1   |
| 16   | 1    | 1    | 1    | 1    | 1   | 1   |

FIRST CONTROL MODE

| CASE | #CS1 | #CS2 | A22D | A22S | #CS | A22 | MODE | |
|------|------|------|------|------|-----|-----|------|---|
| 1 | 0 | 0 | 0 A21 | 0 FIXED | — | — | — | |
| 2 | 1 | 0 | 0 A21 | 0 FIXED | 0 ENABLE | 1 HIGHER | 1 | 26 |
| 3 | 0 | 1 | 0 A21 | 0 FIXED | 0 ENABLE | 0 LOWER | 1 | 28 |
| 4 | 1 | 1 | 0 A21 | 0 FIXED | 1 DISABLE | | 1 | |
| 5 | 0 | 0 | 1 A21 | 0 FIXED | — | — | — | |
| 6 | 1 | 0 | 1 A21 | 0 FIXED | 1 DISABLE | | 1 | 24 |
| 7 | 0 | 1 | 1 A21 | 0 FIXED | 0 ENABLE | 0 LOWER | 1 | 28 |
| 8 | 1 | 1 | 1 A21 | 0 FIXED | 1 DISABLE | | 1 | |

SECOND CONTROL MODE

| CASE | #CS1 | #CS2 | A22D | A22S | #CS | A22 | MODE |
|---|---|---|---|---|---|---|---|
| 5 | 0 | 0 #CS1 | 1 FIXED | 0 | 0 ENABLE | 0 | 2 |
| 13 | 0 | 0 #CS1 | 1 FIXED | 1 | 0 ENABLE | 1 | 2 |
| 8 | 1 | 1 #CS1 | 1 FIXED | 0 | 1 DISABLE | 0 | 2 |
| 16 | 1 | 1 #CS1 | 1 FIXED | 1 | 1 DISABLE | 1 | 2 |

MEMORY DEVICE WHICH CAN CHANGE CONTROL BY CHIP SELECT SIGNAL

CROSS-REFERENCE TO RELATED APPLICATIONS

This application is based upon and claims the benefit of priority from the prior Japanese Patent Application No. 2002-72725, filed on Mar. 15, 2002, the entire contents of which are incorporated herein by reference.

BACKGROUND OF THE INVENTION

1. Field of the Invention

The present invention relates to a memory device which can be selected by a chip select signal, and more particularly to a memory device which can change control by a chip select signal, and a memory device which can control by a plurality of chip select signals.

2. Description of the Related Art

A memory device such as a non-volatile semiconductor memory, including a flash memory, is normally selected by a chip select signal, writes data to a memory cell specified by an address signal, and reads data from the memory cell. For such a memory device, access is controlled by a memory control unit such as a CPU and memory controller (hereafter referred to as CPU). The CPU which controls a plurality of memory devices selects one of the memory devices by a chip select signal, and supplies a predetermined number of bits of address signal to access a specific memory device. The address signal is commonly supplied to a plurality of memory devices under control.

Therefore a memory area which can be selected by a single chip select signal is restricted by the number of bits of the address signal. For example, if the bus width is 16 bits and the address signal is 22 bits, 64 MB of memory area can be accessed. Therefore a CPU having a 22 bit address signal can use a memory area exceeding 64 MB by using a plurality of chip select signals.

FIG. 1 is a diagram depicting the relationship of a conventional CPU and 2 memory devices. The CPU 10 is connected with 2 memory devices 12 and 14 in parallel by a bus which supplies 22 bit addresses A0–A21 and a predetermined bit of data. And the CPU 10 outputs an address signal and supplies the chip select signals CS1 or CS2 to the corresponding memory devices. The memory device selected by the chip select signal is activated and executes the access operation to a memory cell corresponding to the address signals A0–A21.

FIG. 2 is a diagram depicting an example of the memory space of the CPU shown in FIG. 1. In this example, the memory A has a 64 MB memory area, and the memory B has a 32 MB memory area (or memory area less than 32 MB). Since the address signal, A0 to A21, has only 22 bits, the memory area which the CPU can control by the address signal is 64 MB. The CPU, on the other hand, can access 128 MB of memory space (memory area) by using 2 chip select signals, CS1 and CS2, in addition to the address signal.

In the above example, however, the memory B has only a 32 MB or less memory area, so a 64 MB-96 MB area of memory space cannot be used. Such a situation occurs when the memory B is a memory which capacity is restricted, such as a high-speed RAM.

Therefore it is expected that the area of the memory A is expanded so that the memory space which cannot be used, 64 MB-96 MB area, can be used. For this, the second memory A having a 32 MB area, which is half of memory A, must be added. And it is necessary to supply the same chip select signal CS2 to the second memory A and memory B, and to select the second memory A or memory B by the address signal.

However if the second memory A is added, the CPU controls a total of 3 memory devices. An increase in the number of memory devices in this way is inappropriate for applications where the requirement to save space for mounting devices is strict, such as a portable telephone and portable information terminal.

So an alternative is to use a memory device having 64 MB+32 MB, a total 96 MB area, or an area larger than this, such as 128 MB, as a large capacity memory instead of the memory A. Such a large capacity memory device, however, requires a 23 bit address signal, and cannot be controlled by a CPU which has only the 22 bit address terminal shown in FIG. 1. As FIG. 2 shows, this CPU 10 uses 2 chip select signals CS1, CS2 in addition to the 22 bit address to control the 128 MB address area, but only 1 chip select signal can be supplied to a ordinary memory device. As a result, the large capacity memory device having a capacity which exceeds the memory area, which can be controlled by one chip select signal, cannot be directly connected to the CPU 10.

SUMMARY OF THE INVENTION

With the foregoing in view, it is an object of the present invention to provide a memory device which can be directly connected to the memory control unit, even if the memory area exceeds the area which can be controlled by one chip select signal at the memory control unit side.

It is another object of the present invention to provide a memory device which can change between one control by a single chip select signal and another control by a plurality of chip select signals.

To achieve the above objects, the first aspect of the present invention is a memory device comprising an address terminal for inputting a plural bits of address signal, and a chip select terminal for inputting an external chip select signal, and an access mode controlling circuit which can switch a first control mode for controlling enable/disable of the memory device according to a plurality of external chip select signals and a predetermined address signal in the address signal to be input, and a second control mode for controlling enable/disable of the memory device according to a single external chip select signal.

If the memory device has a second memory area larger than a first memory area which can be controlled by a single chip select signal of the memory control unit, the memory device can be directly connected to the memory control unit by setting the access mode control circuit to the first control mode. In the first control mode, enable/disable of the memory device is controlled according to a plurality of external chip select signals and a predetermined address signal in the address signal to be input, so this memory device can be directly connected to the memory control unit, even if this memory device has an area exceeding the memory area which the memory control unit can control by a single chip select signal.

Also according to the above mentioned memory device, if the memory device has a memory-area less than the first memory area, which the memory control unit can control by a single chip set, then the access mode control circuit is set to the second control mode. Therefore the present invention can provide a memory device which can flexibly support various memory control units.

To achieve the above objects, the second aspect of the present invention is the memory device according to the first aspect, wherein in a first control mode, the access mode controlling circuit controls the memory device to be in enable status when one of the plurality of external chip select signals is in enable status, and controls the memory device in disable status according to the predetermined address signal, even if one external chip select signals is in enable status.

According to the second aspect of the present invention, when the memory control unit accesses a part of the memory area which can be controlled by the address signal and the plurality of chip select signals both to be supplied, this memory device is disabled so that access to an other memory device different from this memory device can be enabled. Therefore it is possible that a part of the memory device which the memory control unit can control is assigned to the other memory device, and the rest of the memory area is assigned to this memory device. As a result, the memory area which the memory control unit can control can be used effectively.

According to a preferable embodiment, in the first aspect of the present invention, if the memory chip in the memory device has the access mode control circuit which is switched to the first control mode, this memory chip is accommodated in a package having a plurality of chip select terminals, and if the memory chip has the access mode control circuit which is switched to the second control mode, the memory chip is accommodated in the package having a single chip select terminal. In this embodiment, a common memory chip can support the memory device having the first control mode function and the memory device having the second control mode function.

DESCRIPTION OF THE PREFERRED EMBODIMENTS

Embodiments of the present invention will now be described with reference to the accompanying drawings. However the scope of protection of the present invention is not limited by the following embodiments, but covers the inventions stated in the claims and equivalents thereof.

Figure 1:
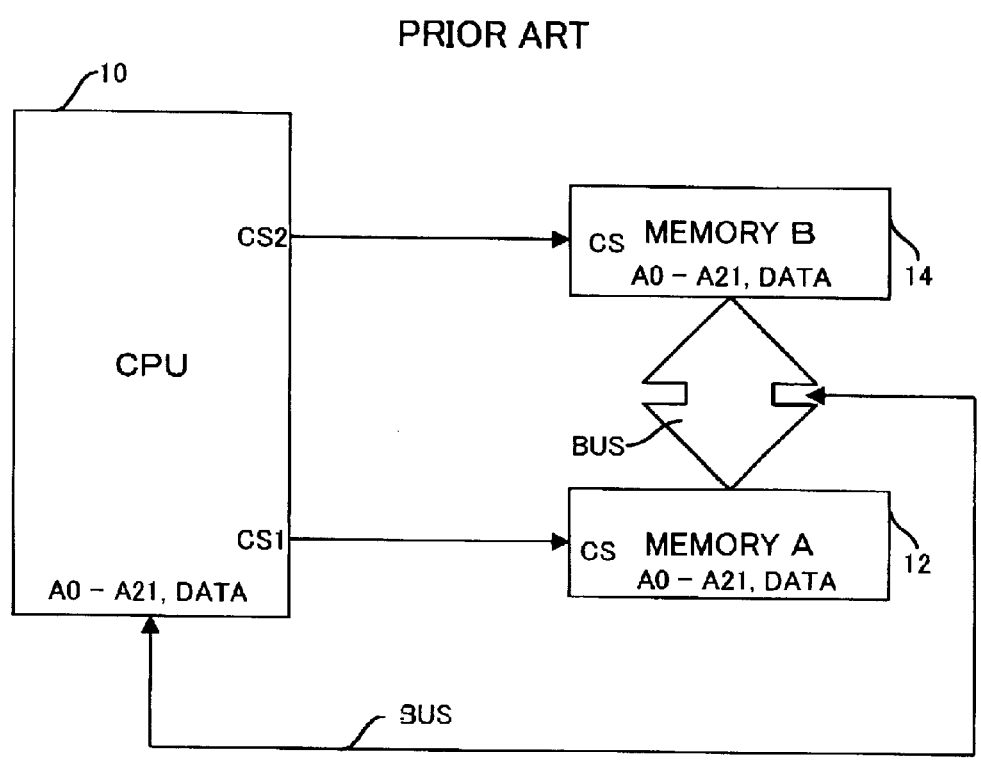
FIG. 1 is a diagram depicting the relationship between a conventional CPU and 2 memory devices.
Figure 2:
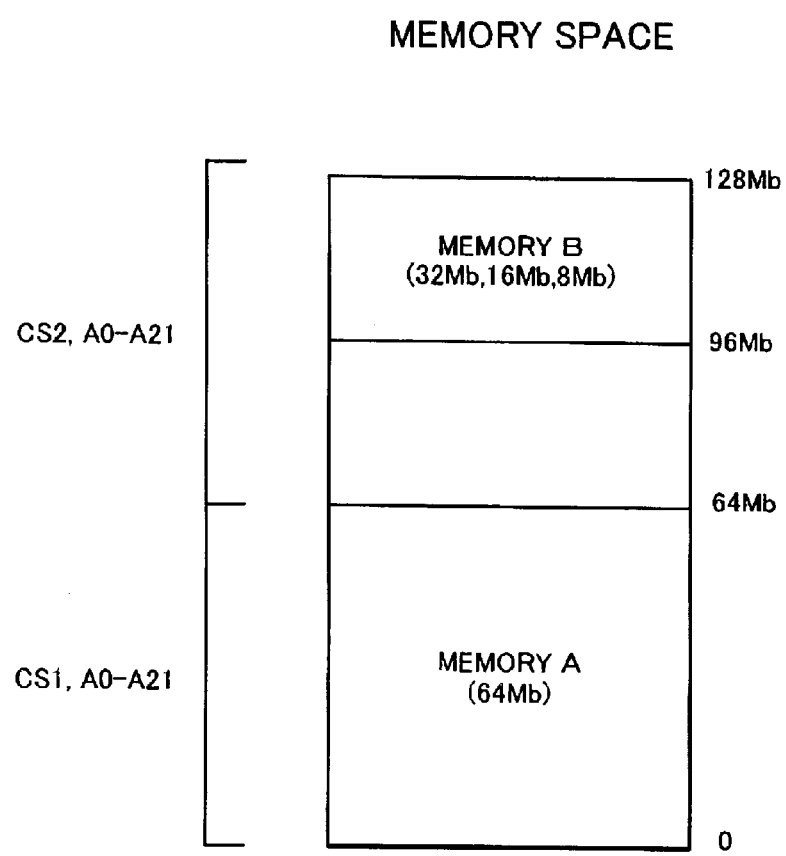
FIG. 2 is a diagram depicting an example of the memory space of the CPU in FIG. 1.
Figure 3:
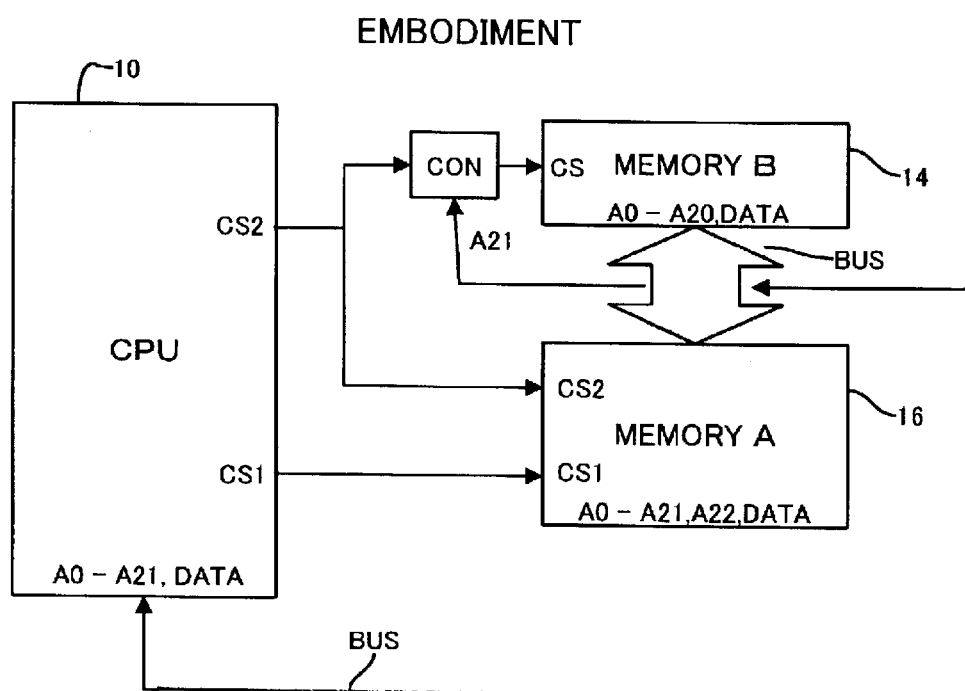
FIG. 3 is a diagram depicting the relationship between the memory control unit and the memory device in the first control mode in the present embodiment.
Figure 4:
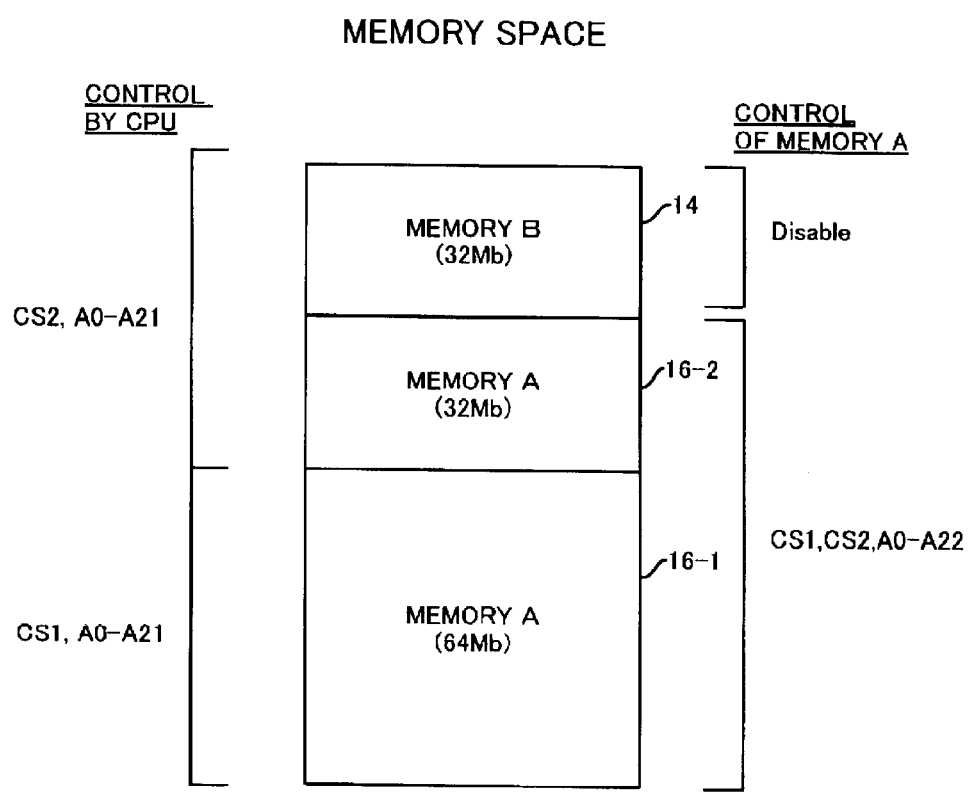
FIG. 4 is a diagram depicting the memory space in FIG. 3.

FIG. 3 is a diagram depicting the relationship between the memory control unit and the memory device in the first control mode in the present embodiment. FIG. 4 is a diagram depicting the memory space in FIG. 3. In the same way as in FIG. 1, the CPU, which is the memory control unit, controls 128 MB of memory area (or memory space) using 22 bit addresses A0–A21 and 2 chip select signals CS1 and CS2. The memory device 16 has 23 bit addresses A0–A22 and a 96 MB (or more, 128 MB or less) memory area, and the memory device 14 has 21 bit addresses A0–A20 and a 32 MB (or less) memory area. By this, the entire 128 MB memory area which the memory control unit can control can be used.

Also the memory A can be directly connected to the CPU 10 even if the memory A has a memory area exceeding the memory area which the CPU 10, which is the memory control unit, can control by one chip select signal. Enable/disable of the memory A are controlled by the 2 chip select signals CS1 and CS2 and the most significant address A21 supplied by the CPU 10.

As the memory space in FIG. 4 shows, the memory space which the CPU 10 can control is divided into the 64 MB memory space 16-1, 32 MB memory space 16-2, and 32 MB memory space 14. The memory spaces 16-1 and 16-2 correspond to the memory area (96 MB) of the memory A, and the memory space 14 corresponds to the memory area (32 MB) of the memory B.

The memory space 16-1 is controlled by the CPU 10 using the first chip select signal CS1 and the addresses A0–A21. And the memory spaces 16-2 and 14 are controlled by the CPU 10 using the second chip select signal CS2 and the addresses A0–A21.

Figure 5:
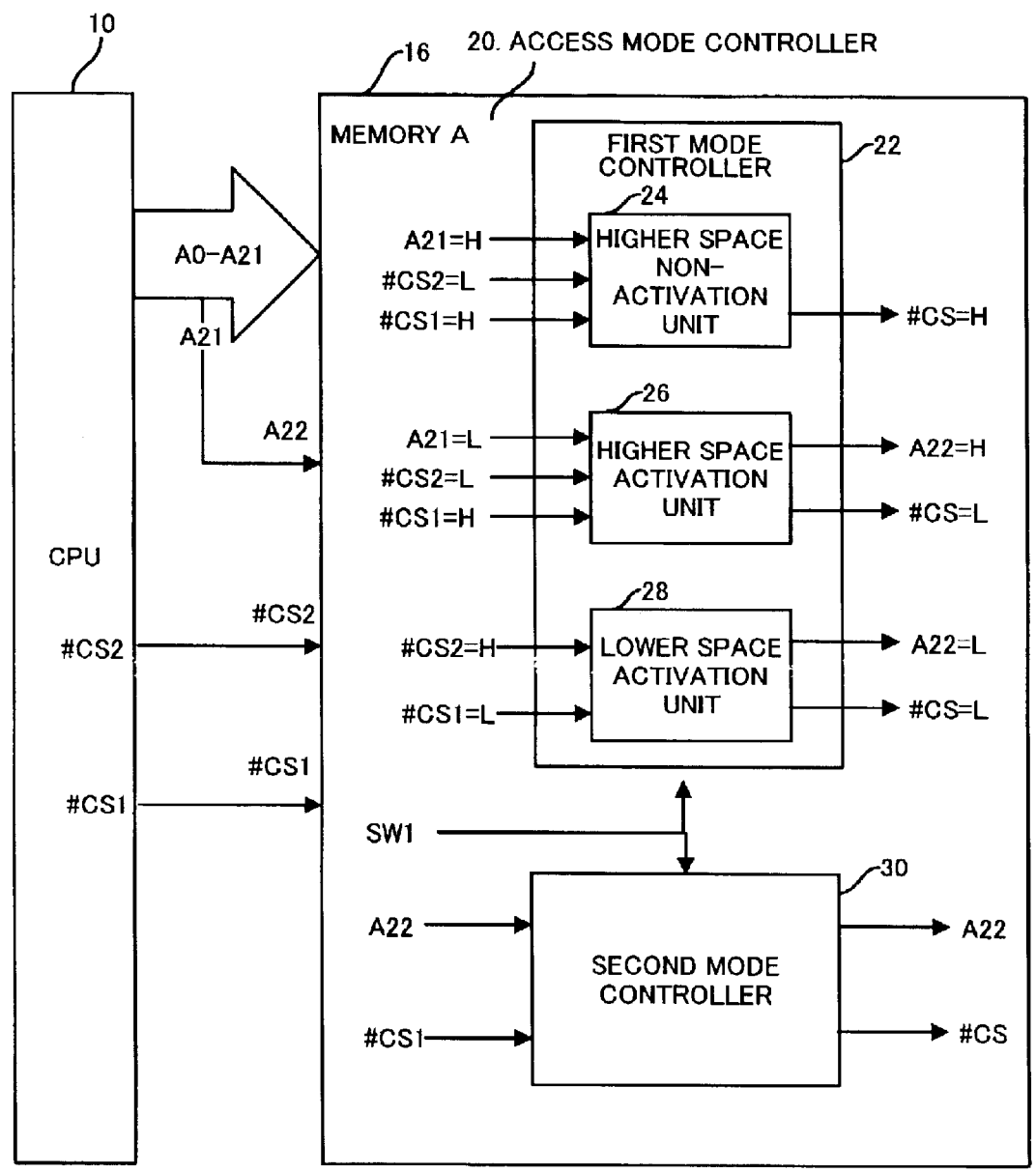
FIG. 5 is a diagram depicting the access mode control circuit of the memory device in the first control mode in the present embodiment.

FIG. 5 is a diagram depicting the access mode control circuit of the memory device in the first control mode in the present embodiment. FIG. 5 shows the function of the access mode control circuit. The access mode includes the first control mode for controlling enable/disable of the internal memory 16 using the 2 chip select signals CS1 and CS2 and the supply address A21, and the second control mode for controlling enable/disable of the internal memory 16 using 1 chip select signal. The access mode control circuit 20 has the first mode control circuit 22 corresponding to the first control mode, and the second mode control circuit 30 corresponding to the second control mode.

The memory device 16 in FIG. 5 has an internal memory, which is not indicated in FIG. 5, to which the internal chip select signal #CS and the addresses A0–A22 are supplied. The internal memory is comprised of a decoder for decoding the address and cell array which has memory cells to be selected by the decoder, and the internal memory becomes enable status when the internal chip select signal #CS is in L level (or logic "0"), and becomes disable status when the internal chip select signal #CS is in H level (or logic "1").

of the chip enable signal refers to the activated status in L level (or logic "0"). In this description, the binaries "0" and "1" correspond to the L level and H level of the signal.

The first mode control circuit 22 in FIG. 5 has a lower space activating function to set the internal chip select signal #CS to L level and the most significant address A22 at the memory side to L level when the first and second external chip select signals #CS1 and #CS2 are #CS1=L and #CS2= H. This function allows access to the memory area 16-1 in FIG. 3, where the internal memory is controlled to be in enable status by setting the internal chip select signal #CS to L level, and the most significant address A22 at the memory side is fixed to L level in order to select the lower memory space 16-1. This function is implemented by the lower space activation unit 28.

The first mode control circuit 22 also has a higher space activation function to set the internal chip select signal #CS to L level and the most significant address A22 at the memory side to H level when the first and second external chip select signals #CS1 and #CS2 are #CS1=H and #CS2= L, and the supply address A21 is at L level. This function allows access to the memory area 16-2 in FIG. 3, where the internal memory is controlled to be in enable status by setting the internal chip select signal #CS to L level, and the most significant address at the memory side is fixed to H level to select the higher memory space 16-2. However the supply address A21 must be at L level in order to confirm that this access is not to the memory space 14. This function is implemented by the higher space activation unit 26.

The first mode control circuit 22 also has a higher space non-activation function to set the internal chip select signal #CS to H level when the first and second external chip select signals #CS1 and #CS2 are #CS1=H and #CS2=L, and the supply address A21 is at H level. This function controls the internal memory of the memory A to be in disable status, whereas the memory area 14 in FIG. 3 is accessed.

The first mode control circuit 22 is controlled to be activated status by the switch signal SW1, and at this time, the second mode control circuit 30 having the second control mode function is controlled to be non-activated status. The first control mode is set by setting or fixing the switch signal SW1 to be a predetermined logical value level.

To support the above mentioned access mode control circuit 20, the 2 external chip select signals #CS1 and #CS2 from the CPU 10 are supplied to the chip select terminals #CS1 and #CS2 of the memory device 16, the 22 supply addresses A0–A21 from the CPU 10 are supplied to the address terminals A0–A21 of the memory device 16, and the most significant supply address A21 from the CPU 10 is supplied to the most significant address terminal A22 of the memory device 16. The memory device 16 fixes the terminal of the switch signal SW1 of the internal memory chip to the first status, and fixes the first mode control circuit 22 to activated status.

The memory device 14 inputs the external chip select signal #CS2 from the CPU 10 to the chip select signal terminal CS via the selection control circuit CON. To the selection control circuit CON, the address signal A21 is supplied along with the external chip select signal #CS2, and when the chip select signal #CS2 is at L level (enabled status) and the address signal A21 is at H level, the chip select signal CS at L level is supplied to the memory device 14. By this, the memory device 14 is controlled to be in enable status when the memory space 14 is accessed.

Figure 6:
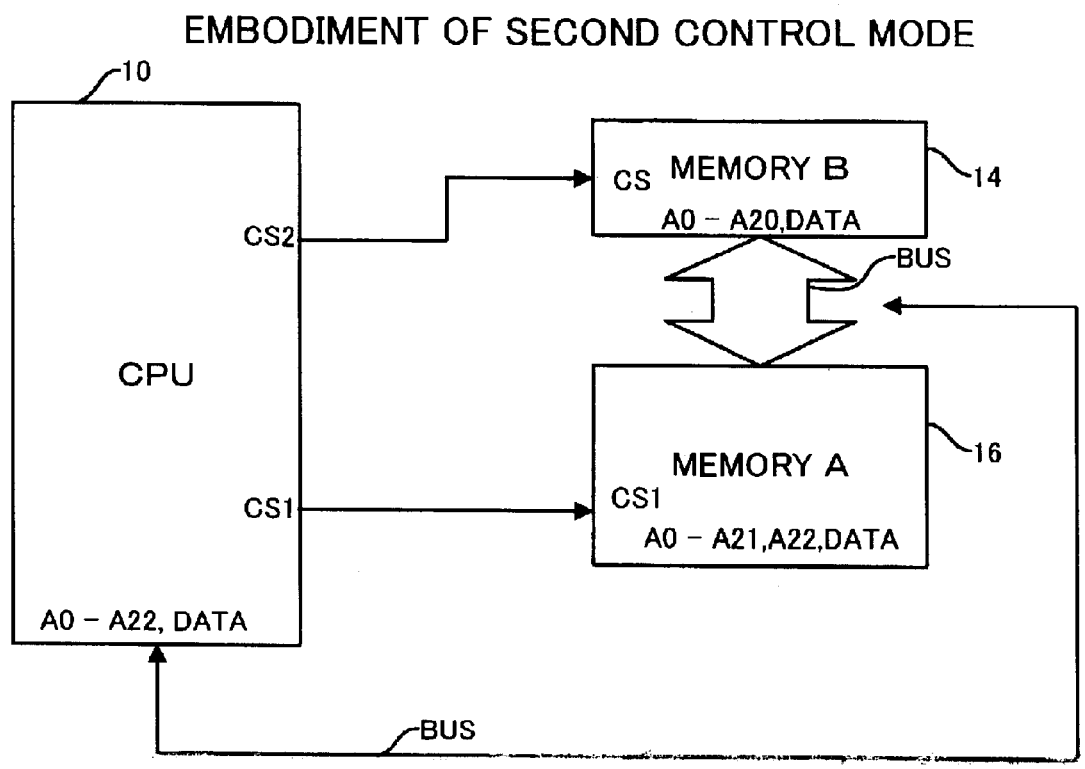
FIG. 6 is a diagram depicting the relationship between the memory control unit and the memory device in the second control mode in the present embodiment.
Figure 7:
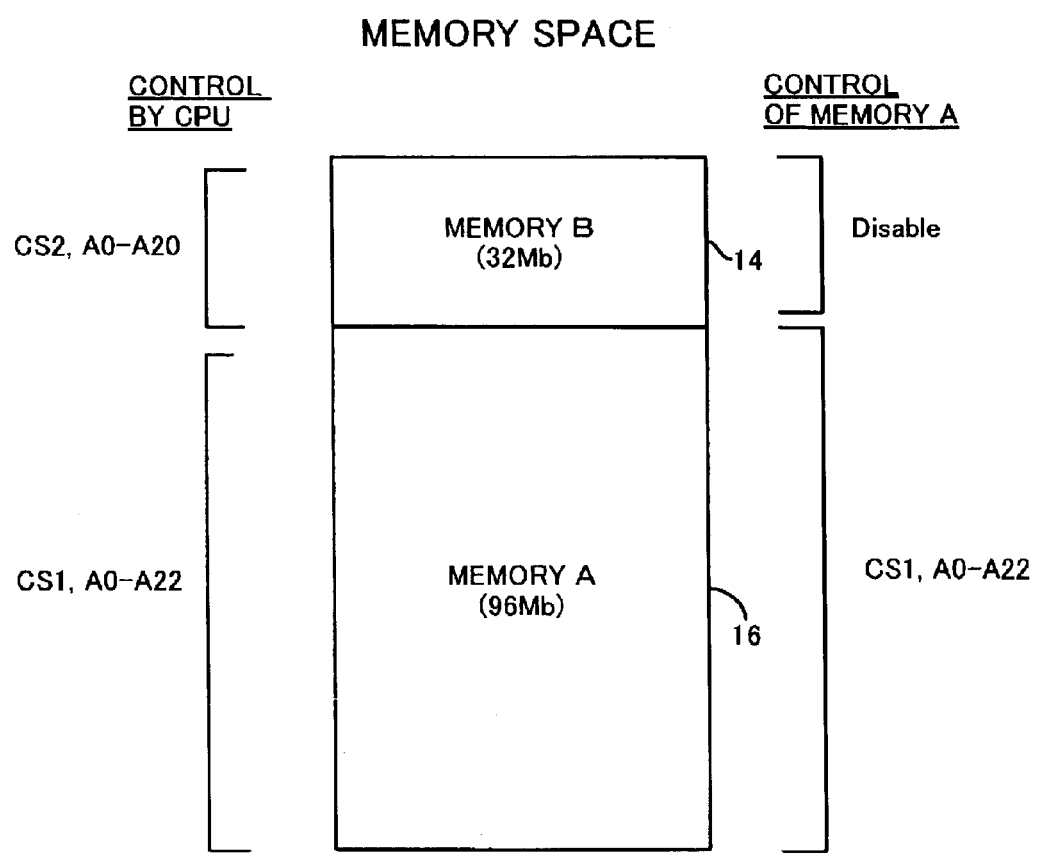
FIG. 7 is a diagram depicting the memory space in FIG. 6.

FIG. 6 is a diagram depicting the relationship between the memory control unit and the memory device in the second control mode. FIG. 7 is a diagram depicting the memory space in FIG. 6. The CPU, which is the memory control unit, has 23 bit addresses A0–A22, unlike FIG. 3, and can control a 128 MB memory area (or memory space) according to the 1 chip select signal CS1. The memory device 16, on the other hand, has 23 bit addresses A0–A22 and a 96 MB memory area, just like FIG. 3, and the memory device 14 has 20 bit addresses A0–A20 and a 32 MB memory area.

Therefore in this case, the memory A does not exceed the memory area which the CPU 10, that is the memory control unit, can control using the 1 chip select signal. So the memory A can be directly connected to the CPU 10 as usual, and the memory A is controlled to be in enable status by the 1 external chip select signal CS1 supplied by the CPU 10, and accesses to the internal memory cell is controlled by the addresses A0–A22 to be supplied.

As the memory space in FIG. 7 shows, the memory space which the CPU 10 can control can be divided into the 96 MB memory space 16, which corresponds to the entire memory area of the memory A, and the 32 MB memory space 14, which corresponds to the memory area of the memory B. The memory space 16 is controlled by the CPU 10 using the first chip select signal CS1 and the addresses A0–A22. The memory space 14 is controlled by the CPU 10 using the second chip select signal CS2 and the addresses A0–A22.

The access to the memory B is controlled by the external chip select signal CS2 and the address signals A0–A20 from the CPU 10. Since the common chip select signal CS2 is not shared with the memory A, the control circuit CON shown in FIG. 3 is unnecessary.

Figure 8:
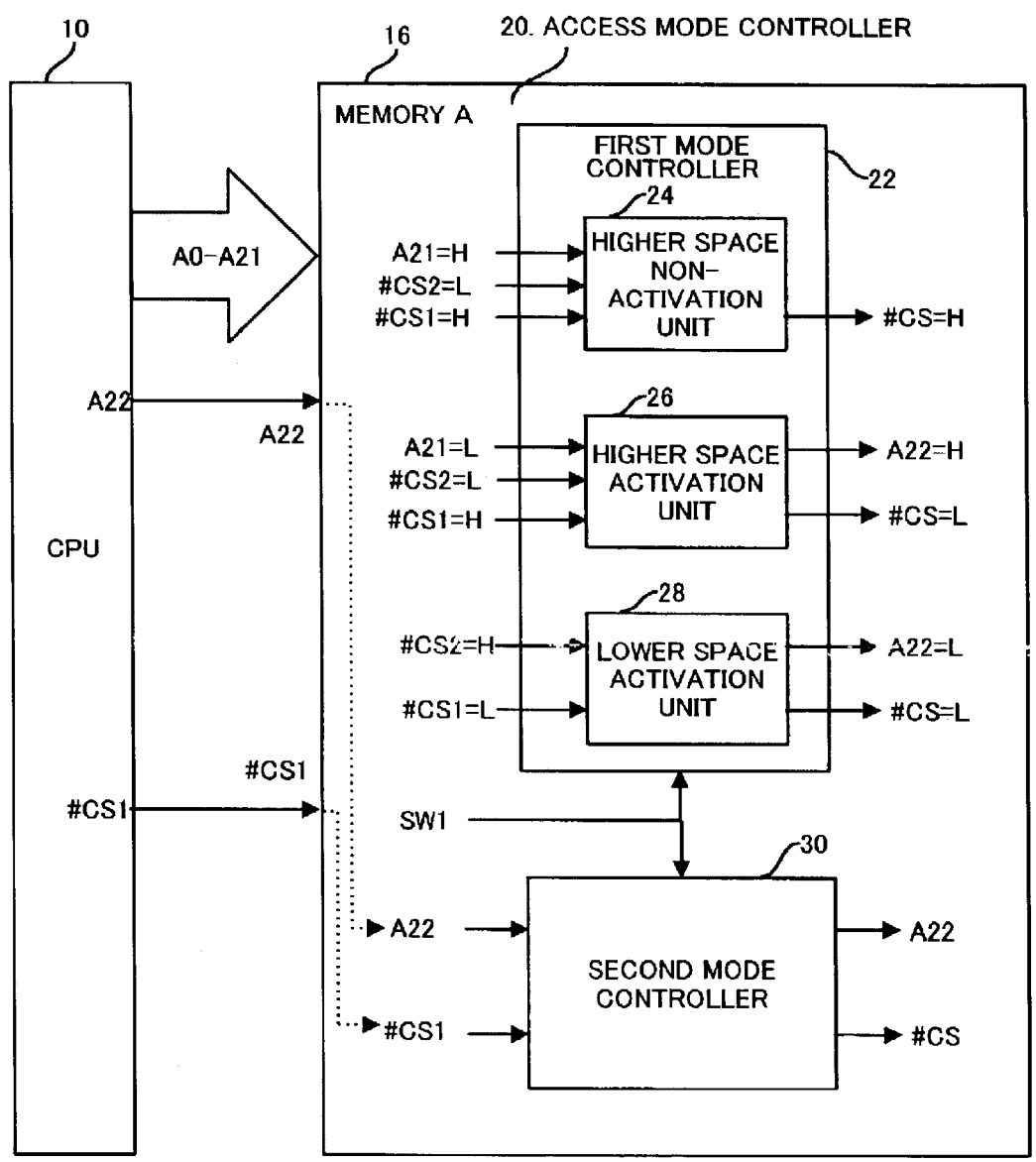
FIG. 8 is a diagram depicting the access mode control circuit of the memory device in the second control mode in the present embodiment.

FIG. 8 is a diagram depicting the access mode control circuit of the memory device in the second control mode in the present embodiment. In FIG. 8, the access mode control circuit 20 is controlled to be the second control mode, and therefore the second mode control circuit 30 is activated by the switch signal SW1. And just like FIG. 6, the addresses A0–A22 supplied by the CPU 10 are directly connected to the address terminals A0–A22 of the memory device 16, and the external chip select signal #CS1 supplied by the CPU 10 is directly connected to the chip select terminal #CS1 of the memory device 16.

Then the external chip select signal #CS1 is at L level, the internal chip select signal #CS of the memory device is set to L level by the second mode control circuit 30, and the internal memory, which is not indicated in FIG. 8, is set to be in enable status. When the external chip select signal #CS1 is at H level, the internal chip select signal #CS of the memory device is set to H level by the second mode control circuit 30, and the internal memory is set to be in disable status.

As mentioned above, enable/disable are controlled by the 1 chip select signal in the second control mode, so this access control is the same as the access control of a normal memory device.

One feature of the present embodiment is that the access mode control circuit 20 embedded in the memory device is switchable between the first mode control circuit 22 and the second mode control circuit 30 by the switch signal SW1. To enable this switching, the access mode control circuit 20 has the first mode control circuit 22 and the second mode control circuit 30 physically separate. In another embodiment, a common circuit constituting the access mode control circuit 20 may function as the first mode control circuit 22 or the second mode control circuit 30 by the switch signal SW1.

Figure 9:
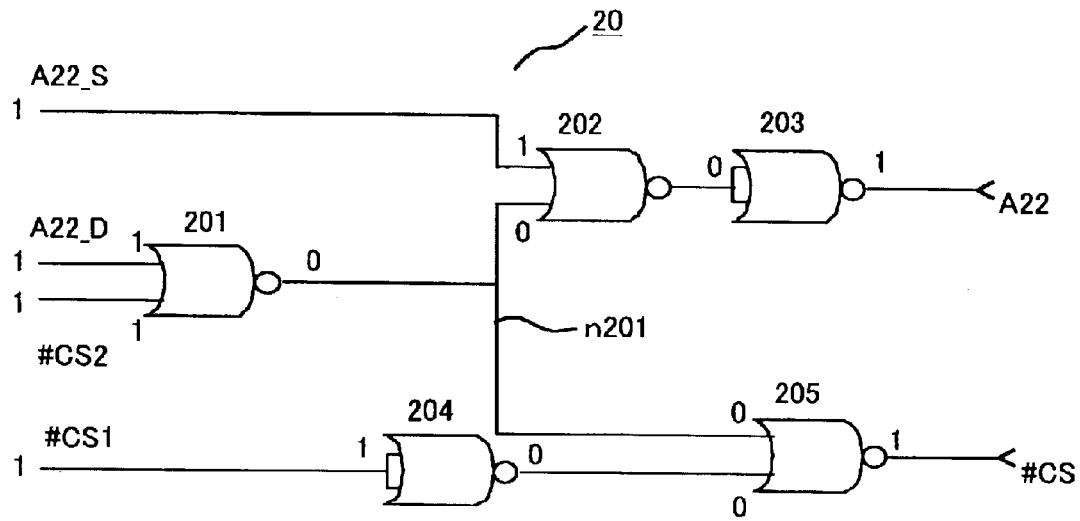
FIG. 9 is a diagram depicting a preferable access mode control circuit and the operation thereof in the present embodiment.
Figure 10:
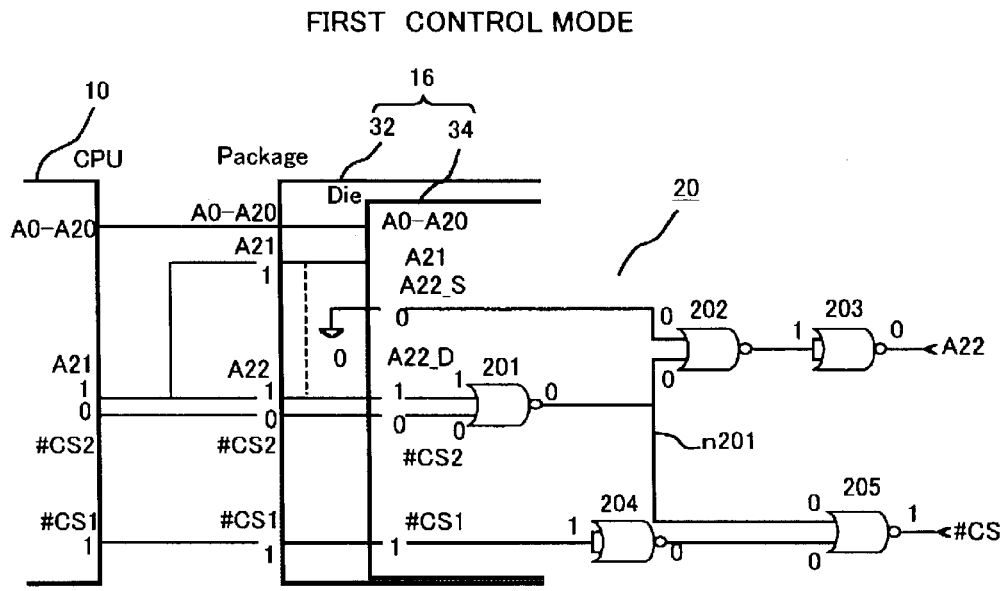
FIG. 10 is a diagram depicting a preferable access mode control circuit and the operation thereof in the present embodiment.
Figure 11:
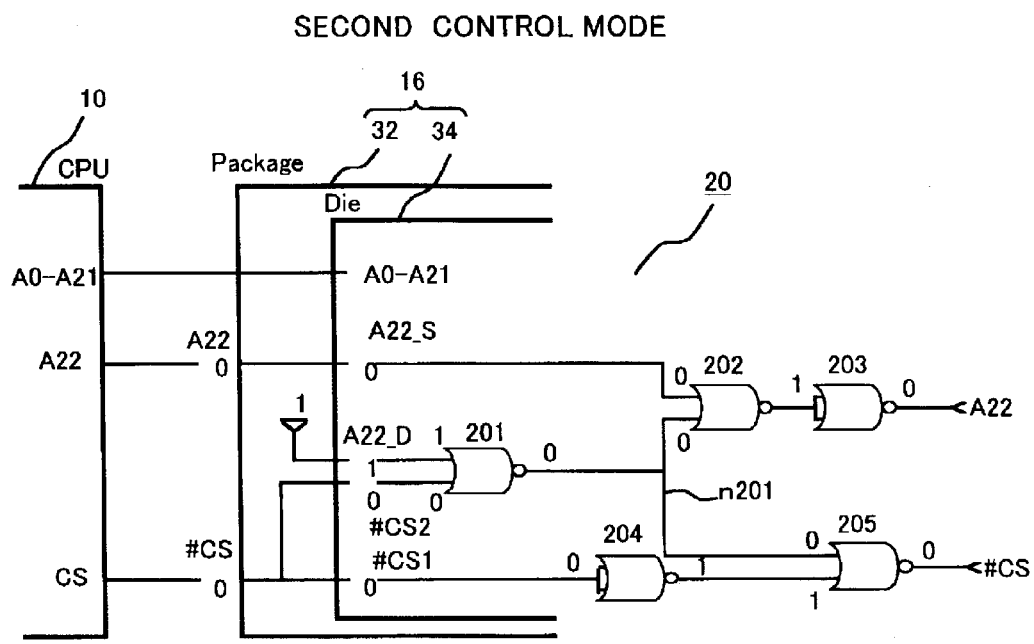
FIG. 11 is a diagram depicting a preferable access mode control circuit and the operation thereof in the present embodiment.

FIG. 9, FIG. 10 and FIG. 11 are diagrams depicting the preferable access mode control circuit and the operations thereof. Each drawing shows the logical circuit and logical value table thereof. This access mode control circuit is an example where the first mode control circuit and the second mode control circuit are configured to be switchable by a predetermined switch signal.

In the control circuit 20 in FIG. 9, the first and second external chip enable signals #CS1 and #CS2 and the first and second most significant address signals A22D and A22S are input as input signals. And the second external chip enable signal #CS2 and the first most significant address signal A22D are input to the NOR gate 201. The output n201 of the NOR gate 201 is input to the NOR gates 202 and 205, and controls the input of the second most significant address signal A22S and the first external chip enable signal #CS1 to be input to these NOR gates 202, 205. In addition to this, the inverters 203 and 204 are installed respectively. Also the internal chip enable signal #CS and the internal most significant address A22 are generated as output.

In the circuit diagram, the logical value of each node, when all the inputs are logic "1", is shown as an example.

The logical value table in FIG. 9 shows the operation of the control circuit for 16 types of input patterns by 4 inputs. As mentioned above, "0" corresponds to L level and "1" corresponds to H level. The control circuit sets the output n201 thereof to "1" only when both the second external chip enable signal #CS2 and the first most significant address signal A22D to be input to the NOR gate 201 are "0", so as to fix the output of the NOR gates 202 and 205 to "0". As a result, the internal chip enable signal #CS is fixed to "0", and the internal most significant address signal A22 is fixed to "1". This corresponds to cases 1, 2, 9 and 10.

If one or both of the second external chip enable signal #CS2 and the first most significant address signal A22D to be input to the NOR gate 201 is/are "1", the control circuit sets the output n201 thereof to "0", and provides the inverter function to the NOR gate 202 or 205 for the other input. In a case other than above, the internal chip enable signal #CS becomes the same as the first external chip enable signal #CS1, and the internal most significant address signal A22 becomes the second most significant address signal A22S. The above is the general operation of the access control circuit.

Now the configuration and the operation of the memory device in the first control mode in FIG. 10 will be described. The memory device 16 has a memory chip 34 and a package 32 which accommodates this memory chip 34. As FIG. 5 shows, the package 32 is comprised of the address terminals A0–A22 and the first and second external chip select terminals #CS1 and #CS2. The supply address signals A0–A21 from the CPU 10 are supplied to the address terminals A0–A21, and the most significant address signal A21 from the CPU is also supplied to the address terminal A22. The corresponding external chip select signals #CS1 and #CS2 are supplied from the CPU 10 respectively to the first and second external chip select terminals #CS1 and #CS2. In FIG. 10, the signal example "0" and "1" for each terminal are shown.

The address terminals A0–A21 of the memory chip 34, on the other hand, are connected to the address terminals A0–A21 of the package respectively, the second most significant address terminal A22S of the memory chip 34 is fixed to L level (or "0"), and the first most significant address terminal A22D is connected to the address terminal A22 of the package so as to input the most significant address A21 from the CPU 10. The first and second chip select terminals #CS1 and #CS2 of the memory chip 34 are connected to the first and second external chip select terminals #CS1 and #CS2 of the package 32 respectively.

In FIG. 10, as an alternative way, the most significant address A21 from the CPU 10 can also be supplied to the first most significant address terminal A22D of the memory chip via the address terminal A21 of the package by. connecting the first most significant address terminal A22D of the memory chip and the address terminal A21 of the package, as shown by the broken line in FIG. 10. By this, the most significant address A21 from the CPU can be supplied only to the address terminal A21 of the package. In this case, nothing is connected to the address terminal A22 of the package.

The first most significant address terminal A22D (D is an abbreviation for double) of the chip is connected to the most significant address terminal A22 of the package 32 in the first control mode, and this enables control using 2 external chip enable signals. At this time, the second most significant address terminal A22S (S is an abbreviation for single) of the chip is fixed to L level. By this, the NOR gate 202 functions as an inverter.

Therefore as the logical value table in FIG. 10 shows, the access mode control circuit 20 operates according to one of cases 1–8 in FIG. 9 in first control mode. Both the first and second external chip select signals #CS1 and #CS2 becoming "0" means that both signals become enable status, which does not occur (case 1, 5). When both the first and second external chip select signals #CS1 and #CS2 are "1", the memory device is not selected, so in this case the internal chip select signal #CS becomes "1", and the memory becomes disable status (cases 4, 8).

The first and second external chip select signals #CS1 and #CS2 being "0" and "1" means that the lower space 16-1 of the memory is selected, where the internal chip select signal #CS becomes "0", and the memory becomes enable status, and the internal most significant address A22 becomes "0" when the second external chip select signal #CS2="1". In other words, the control circuit 20 functions as the lower space activation unit 28 in FIG. 5 (case 3, 7).

The first and second external chip select signals #CS1 and #CS2 being "1" and "0" means that the higher memory space is selected. If the most significant address A21 is "0" at this time, the higher space 16-2 of the memory device is accessed, so the internal chip enable signal #CS becomes "0", and the memory device becomes enable status, the output n201 of the NOR gate 201 becomes "1" according to #CS=0 and A21=0, and the internal most significant address A22 is controlled to "1". At this time, the control circuit 20 functions as the higher space activation unit 26 in FIG. 5 (case 2).

If the most significant address A21 is "1", the memory space 14 is accessed, so the internal chip enable signal #CS becomes "1", and the memory device becomes disable status. In this status, the control circuit 20 functions as the higher space non-activation unit in FIG. 5 (case 6).

Now the configuration and the operation of the memory device in the second control mode in FIG. 11 will be described. The package 32 of the memory device 16 is comprised of the address terminals A0–A22 and the external chip select terminal #CS, as shown in FIG. 8. The supply address signal A0–A22 from the CPU 10 are supplied to the address terminals A0–A22, and the corresponding external chip select signal #CS is supplied from the CPU 10 to the external chip select terminal #CS. In other words, this is a normal connection relationship between the memory device and the CPU. In FIG. 11 as well, an example of signals "0" and "1" for each terminal is shown.

The address terminals A0–A21 of the memory chip 34 are connected to the address terminals A0–A21 of the package respectively, and the second most significant address terminal A22S of the memory chip 34 is connected to the address terminal A22 of the package. The first most significant address terminal A22D of the memory chip 34 is fixed to H level (or logic "1"). Both of the first and second chip select terminals #CS1 and #CS2 of the memory chip 34 are connected to the external chip select terminal #CS of the package 32. The second chip select terminal #CS2 may be fixed to either H level or L level, or may not be connected at all.

The access mode control circuit 20 in FIG. 11 functions as the second mode control circuit 30 for controlling the second control mode. By fixing the first most significant address terminal A22D to logic "1", the output n201 of the NOR gate 201 is fixed to logic "0", and as a result, the NOR gates 202 and 205 function as inverters. As a result, the supply address signal A22 to be input to the second most significant address terminal A22S propagates as the internal most significant address signal A22 via the inverters 202 and 203. The external chip select signal #CS, which is supplied to the first chip select terminal #CS1, also propagates as the internal chip select signal #CS via the inverters 204 and 205.

Therefore if the external chip select signal #CS, which the CPU 10 supplies, is logic "0", then the internal chip select signal also becomes logic "0", that is enable status, and if logic "1", then the internal chip select signal also becomes "1", that is disable status. Also the most significant address A22, which the CPU 10 supplies, becomes the internal most significant address. This operation is as shown in the logical value table in FIG. 11. The operation of this logical value table corresponds to cases 5, 13, 8 and 16 in FIG. 9.

Figure 12:
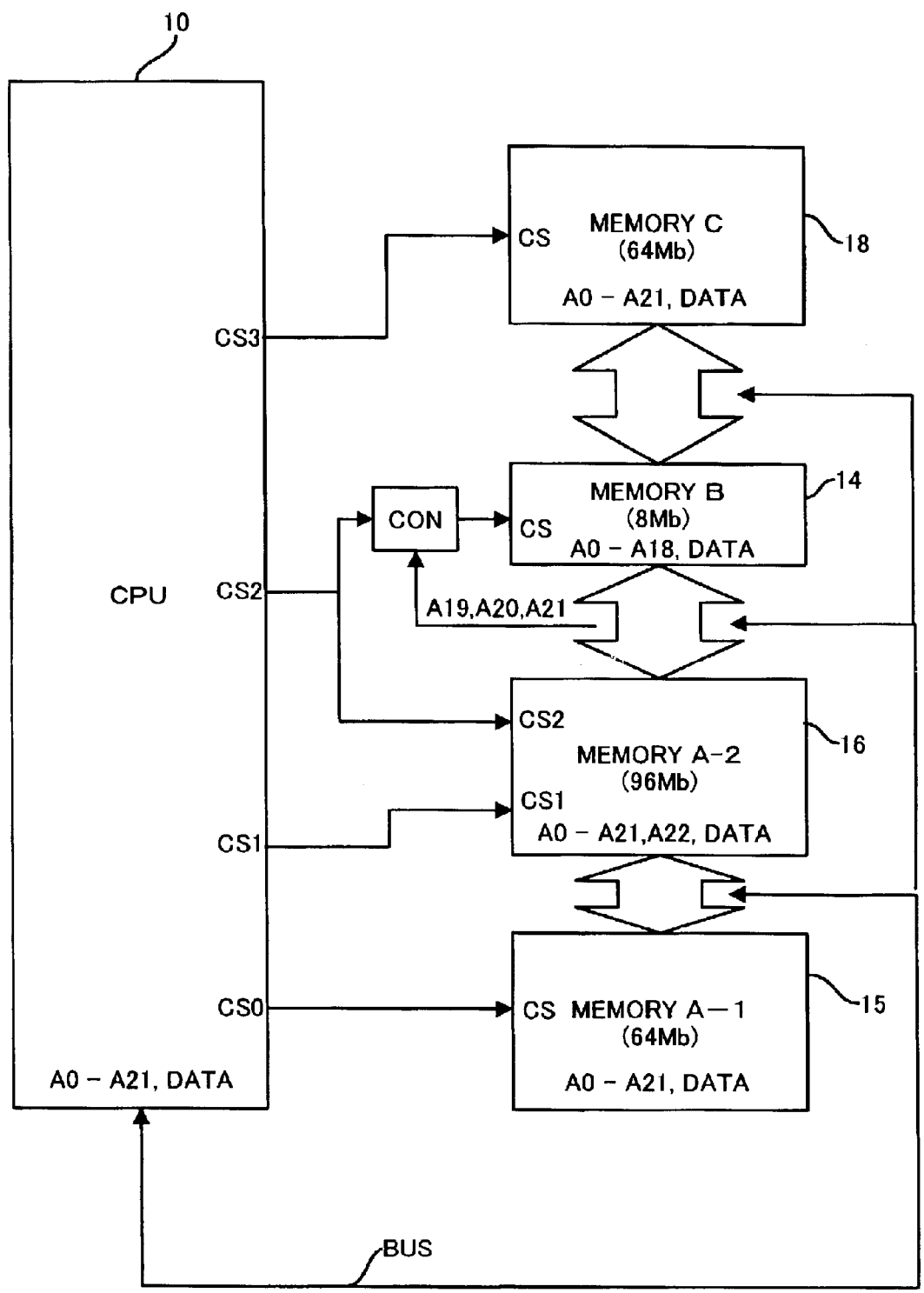
FIG. 12 is a diagram depicting another example using the memory device in the present embodiment.

FIG. 12 is a diagram depicting another example of using the memory device in the present embodiment. In this example, the CPU 10, which is the control unit of the memory, outputs 4 types of chip select signals CS0–4 and 22 address signals A0–A21. Therefore the memory area which can be controlled by 1 chip select signal. is 64 MB if the bus width is 16 bits. The CPU has 4 chip select signals so as to use a 64 MB×4 memory space.

The memories connected to the CPU 10 are, for example, 4 types of memories, that is, a 64 MB memory device 15 and 96 MB memory device 16, as non-volatile memories, and an 8 MB memory device 14 as a high-speed SRAM, and a 64 MB memory device 18 as a DRAM or FCRAM. The relationship between the memory devices 16 and 14 corresponds to the relationship shown in FIG. 3, and the memory device 16 has an area exceeding the memory area which the CPU 10 can control using the 1 chip select signal, so 2 chip select signals CS1 and CS2 are input and the address terminal A22 is also installed.

The memory device 16 has the access mode control circuit configuration, and the memory chip and package configuration shown in FIG. 10. So when the memory space of the memory device 16 is accessed, the memory device 16 is controlled to be in enable status, and when the memory space of the memory device 14 is accessed, the memory device 16 is controlled to be in disable status.

The other memory devices 15 and 18 have 64 MB memory areas respectively, and can be controlled by the corresponding chip select signals CS0 and 3.

By the above configuration, the 4 memory devices 14, 15, 16 and 18 can effectively use the memory space which the CPU can access, even if a memory device 14, which memory capacity is small, is included. So even if the demand to save a mounting space is strict, such as the case of a portable telephone, a memory module which can effectively use the memory space can be provided.

The memory device is configured such that the first control mode and the second control mode can be switched. By combining a common memory chip and a different package, the memory device which executes the first control mode and the memory device which executes the second control mode can be switched.

The memory device 16 has a 96 MB memory area, but can have a 128 MB memory area corresponding to addresses A0 and A22. Also the accessible memory area in the memory device 16 can be increased to 120 MB corresponding to the 8 MB memory area in the memory device 14. For example, the memory device 16, which has a maximum 128 MB memory area, may be connected so that the memory device is controlled to be in enable status when the memory area from the lowest address to the address of 120 MB is accessed, and controlled to be in disable status when the memory area exceeding the above memory area is accessed. In this case the access mode control circuit of the memory device 16 must control enable/disable according to the 3 bit address signals, A21, A20 and A19, to be supplied, and the internal most significant address A22 is controlled as described above.

Figure 13:
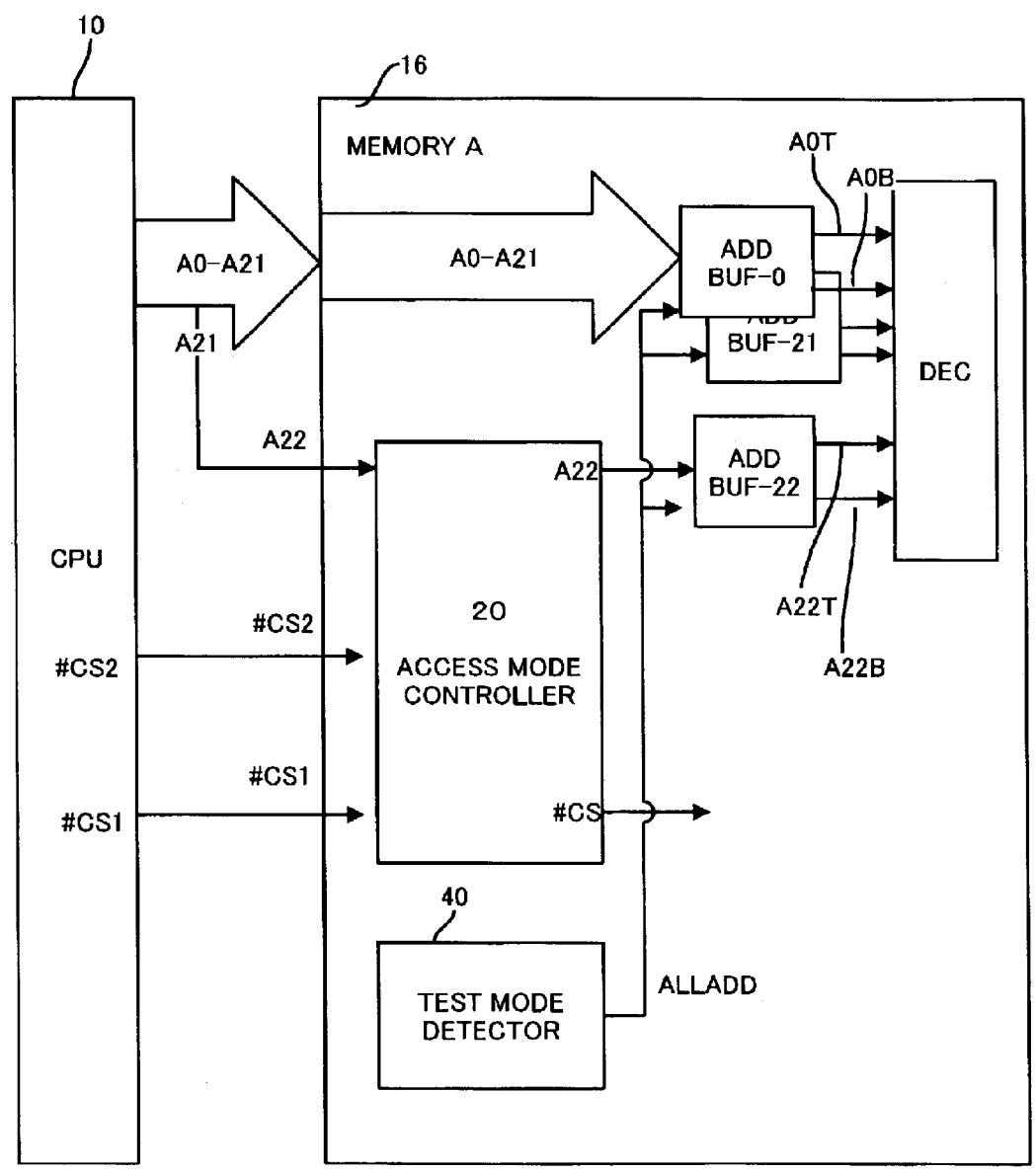
FIG. 13 is a block diagram depicting the memory device in another embodiment.

FIG. 13 is a block diagram depicting the memory device in another embodiment. In the test mode of the memory device, it is necessary to select all the word lines and all the bit lines of the memory cell array, and apply voltage stress to all the memory cells so as to set the memory device to all cell selected status. In this case, all of the non-inverted internal address signals A0T–A22T, and the inverted internal address signals A0B–A22B which each address buffer ADD/BUF0-22 supplies to the decoder DEC, are set to H level.

A general method to set such an all cell selected status is that all the addresses A0–A22 to be supplied to the address buffer are set to the activation level (H level) so that all the non-inverted internal address signals A0T–A22T are set to the activation level (H level), and the all select signals ALLADD generated by the test mode detection circuit 40 are set to the activation level (H level) so that all the inverted internal address signals A0B–A22B are set to the activation level (H level).

However the access mode control circuit 20 is installed, and as shown in FIG. 5, when the external supply address A21 is controlled to L level and the second chip select signal #CS2 is controlled to L level, the internal address A22 is controlled to be H level by the first mode control circuit 22. Therefore it is not possible that the external supply address A21 is set to H level and the internal address A22 is also set to H level.

So according to the present embodiment, if the test mode detection circuit 40 sets the all select signal ALLADD to H level, each address buffer ADD/BUF0-22 sets all the non-inverted internal address signal A0T–A22T and the inverted internal address signals A0B–A22B to H level, regardless the addresses A0–A22 to be supplied.

Figure 14:
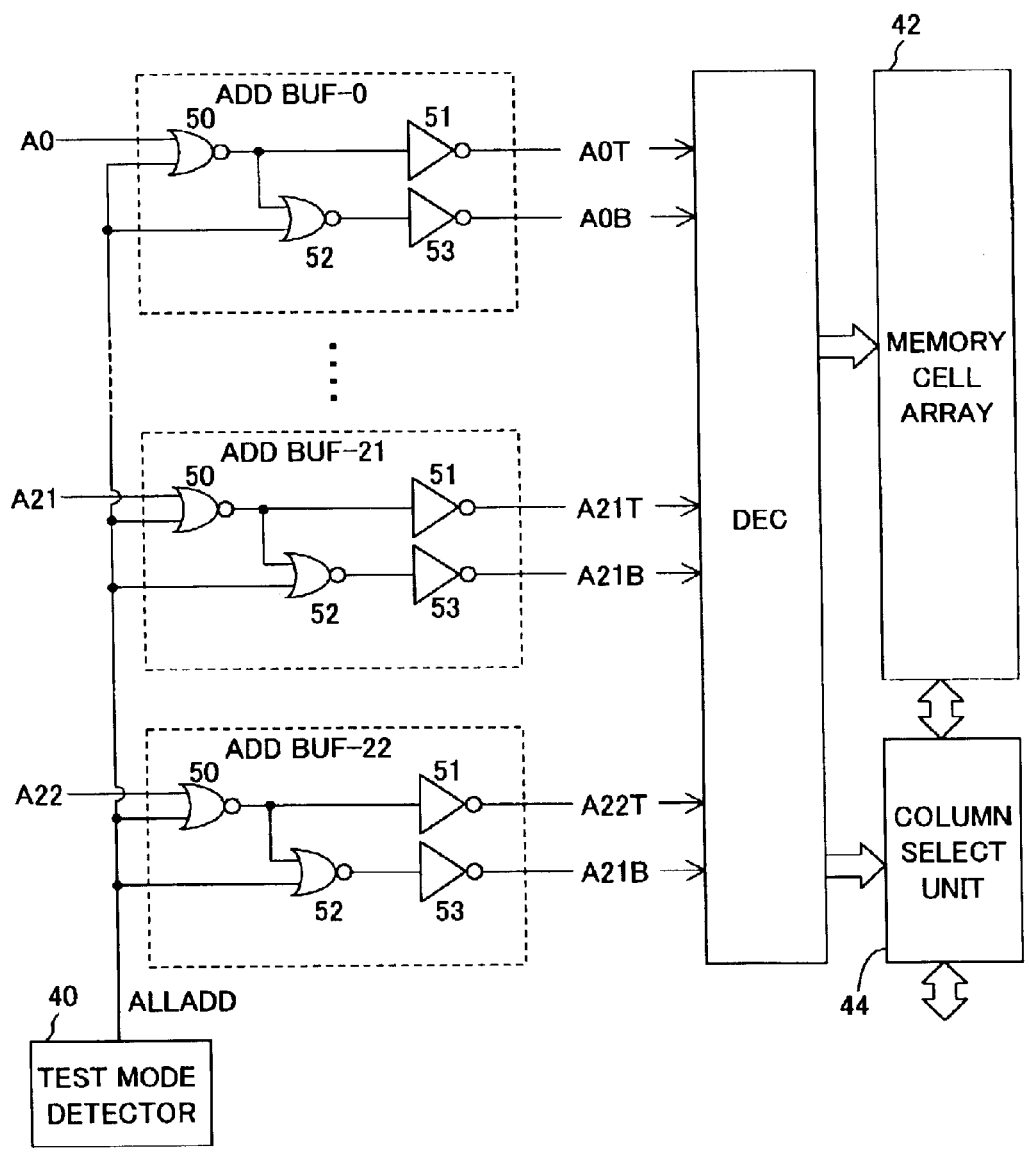
FIG. 14 is a circuit diagram of the address buffer in the present embodiment.

FIG. 14 is a circuit diagram depicting the address buffer in the present embodiment. FIG. 14 shows the decoder DEC, memory cell array 42, and column selection unit 44 in addition to the address buffers ADD/BUF 0, 21, and 22. The non-inverted signals A0T–A22T and the inverted signals A0B–A22B of each address generated by the address buffer are supplied to the decoder DEC, and the decoder selects the sector of the memory cell array, and selects the word line and selects the column. Therefore if all the non-inverted signals and inverted signals of the address to be supplied to the decoder are set to the activation level (H level), and the memory cell array becomes all select status.

The address buffers ADD/BUF 0, 21 and 22 are all comprised of the same circuits. In other words, the address buffer ADD/BUF 0, 21 or 22 is comprised of a NOR gate 50 for inputting the addresses A0–A22 to be supplied, an inverter 51 for inverting the output thereof, a NOR gate 52 for inputting the output of the NOR gate 50, and an inverter 53 for inverting the output thereof. The all select signal ALLADD from the test mode-detection circuit 40 is input to the NOR gates 50 and 52.

In normal operation status, the all select signal ALLADD is at the non-activation level (L level), and the NOR gates 50 and 52, to whose one input the all select signal ALLADD is supplied, operate as an inverter to invert the other input. Therefore the non-inverted signals A0T–A22T and the inverted signals A0B–A22B of the addresses A0–A22 to be supplied are output from the inverters 51 and 53 respectively.

When the test mode detection circuit 40 detects a predetermined test mode and sets the all select signal ALLADD to H level, the output of both the NOR gates 50 and 52 are controlled to be L level, regardless the status of the supply addresses A0–A22. As a result, the non-inverted signals A0T–A22T and the inverted signals A0B–A22B, which are output from both inverters 51 and 53, are all set to H level. By this, the memory cell array is controlled to be in an all cell select status.

In this status, according to the present embodiment, the access mode control circuit installed in the memory chip generates the most significant address A22 internally according to the combination of the address A21 and the second chip select signal #CS2 supplied from the CPU, so the function for controlling the all cell selected status in test mode is implemented in the address buffer circuit at the post stage of the access mode control circuit 20.

In the address buffer to which the addresses A0–A21 are supplied among the address buffers in FIG. 14, the NOR gate 50 may be replaced with a simple inverter without inputting the all select signal ALLADD to the NOR gate 50. The addresses A0–A21 are supplied from the outside to the address buffer without passing through the access mode control circuit 20. So if the addresses A0–A21 supplied from the outside are all set to H level, the non-inverted signals A0T–A21T are all controlled to H level, even if the NOR gate 50 is replaced with an inverter, and the inverted signals A0B–A21B are controlled to be H level by the all select signal ALLADD. The address buffer ADD/BUF 22 corresponding to the most significant address A22 is the circuit shown in FIG. 14, and both the non-inverted signal A22T and the inverted signal A22B are set to H level by the all select signal ALLADD, regardless the supply address A22, as mentioned above.

According to the present invention, even the memory device which has an area exceeding the memory area, where the memory control unit can be controlled by a single chip select signal, can be connected to the memory control unit. Therefore a memory device which can flexibly support a plurality of memory control units can be provided.

What is claimed is:

1. A memory device, comprising:
   at least one address terminal, wherein each address terminal is configured to receive at least one of a plurality of address signals;
   at least one chip select terminal, wherein each chip select terminal is configured to receive at least one of a plurality of external chip select signals; and
   an access mode control circuit which is configured to enable switching of a first control mode for executing enable/disable control of the memory device according to each of the plurality of external chip select signals and a predetermined one of the plurality of address signals, and a second control mode for executing said enable/disable control of the memory device according to a predetermined one of the plurality of external chip select signals.

2. The memory device according to claim 1, wherein the access mode control circuit is set to said first control mode when memory area of said memory device is larger than memory area which a memory control unit for controlling said memory device can control using the predetermined one of the plurality of chip select signals.

3. The memory device according to claim 1, wherein the access mode control circuit is set to said second control mode when memory area of said memory device is equal to or smaller than memory area which the memory control unit for controlling said memory device can control using the predetermined one of the plurality of chip select signals.

4. The memory device according to claim 1, further comprising:
   a memory chip of which said access mode control circuit is set to said first control mode, wherein said at least one chip select terminal comprises a plurality of external chip select terminals; and
   a package which has said plurality of external chip select terminals and accommodates said memory chip.

5. The memory device according to claim 1, further comprising:
   a memory chip of which said access mode control circuit is set to said second control mode, wherein said at least one chin select terminal comprises a single external chip select terminal; and
   a package which has said single external chip select terminal and accommodates said memory chip.

6. The memory device according to claim 1, wherein, in said first control mode, said access mode control circuit controls said memory device to be in enable status when one of the plurality of external chip select signals is in enable status, and controls said memory device to be in disable status according to said predetermined address signal, even if one external chip select signal is in enable status.

7. The memory device according to claim 4, wherein said memory chip further comprises a first most significant address terminal and a second most significant address terminal, a most significant address signal of said address signal to be input is supplied to said first most significant address terminal, said second most significant address terminal is fixed to a predetermined logical level, and said first control mode is executed according to said plurality of external chip enable signals and the input most significant address signal to be supplied to said first most significant address terminal.

8. The memory device according to claim 5, wherein said memory chip further comprises a first most significant address terminal and a second most significant address terminal, said first most significant address terminal is fixed to a predetermined logical level, the most significant address signal of said address signal to be input is supplied to said second most significant address terminal, and second control mode is executed.

9. A memory device, comprising:
   at least one address terminal, wherein each address terminal is configured to receive at least one a plurality of address signals;

at least one chip select terminal, wherein each chip select terminal is configured to receive at least one of a plurality of external chip select signals; and an access mode control circuit which is configured to enable/disable control of the memory device according to each of the plurality of external chip select signals and a predetermined one of the plurality of address signals, wherein said access mode control circuit controls said memory device to be in enable status when one of said plurality of external chip select signals is in enable status, and controls said memory device to disable status according to said predetermined one of the plurality of address signals, even when one of said plurality of external chip select signals is in enable status.

10. The memory device according to claim 9, further comprising:

a higher internal address signal, wherein said access mode control circuit, when controlling in enable status, controls said higher internal address signal to be a predetermined logical level according to said address signal received by said at least address terminal.

11. A memory device, comprising:

at least one address terminal, wherein each address terminal is configured to receive at least one of a plurality of address signal signals;

at least one chip select terminal, wherein each chip select terminal is configured to receive at least one of a plurality of external chip select signal signals; and an access mode control circuit which is configured to enable switching of a first control mode for executing enable/disable control of the memory device according to each of the plurality of external chip select signals, and a second control mode for executing said enable/disable control of the memory device according to a predetermined one of the plurality of external chip select signal signals.

12. The memory device according to claim 11, further comprising:

a memory chip of which said access mode control circuit is set to said first control mode, wherein said at least one chip select terminal comprises a plurality of external chip select terminals; and a package which has said plurality of external chip select terminals and accommodates said memory chip.

13. The memory device according to claim 11, further comprising:

a memory chip of which said access mode control circuit is set to said second control mode, wherein said at least one chip select terminal comprises a single external chip select terminal; and a package which has said single external chip select terminal and accommodates said memory chip.

14. A memory device, comprising:

at least one address terminal, wherein each address terminal is configured to receive at least one of a first plurality of address signals;

at least one chip select terminal, wherein each chip select terminal is configured to receive at least one of a plurality of external chip select signals;

an access mode control circuit which is configured to enable said enable/disable control of the memory device according to each of the plurality of external chip select signals and a predetermined one of the first plurality of address signals, and to generate a second plurality of address signals;

an address buffer which is configured to receive said first plurality of address signals and said second plurality of address signals, and to generate non-inverted signals and inverted signals of said first plurality of address signals and said second plurality of address signals; and a decoder configured to receive and decode the non-inverted signals and inverted signals, wherein at least one portion of said address buffer controls all of said non-inverted signals and inverted signals to an activation level in response to an all select signal independent of the first plurality of address signals and the second plurality of address signals.

15. The memory device according to claim 14, further comprising:

a test mode detection circuit which detects a predetermined test mode and generates said all select signal.

* * * * *